United States Patent [19]

Ikenaga et al.

[11] Patent Number: 4,623,256
[45] Date of Patent: Nov. 18, 1986

[54] APPARATUS FOR INSPECTING MASK USED FOR MANUFACTURING INTEGRATED CIRCUITS

[75] Inventors: Osamu Ikenaga; Ryoichi Yoshikawa, both of Kawasaki, Japan

[73] Assignee: Kabushiki Kaisha Toshiba, Kawasaki, Japan

[21] Appl. No.: 674,652

[22] Filed: Nov. 26, 1984

[30] Foreign Application Priority Data

Nov. 24, 1983 [JP] Japan .................................. 58-220980

[51] Int. Cl.⁴ ............................................ G01B 11/00
[52] U.S. Cl. ......................................... 356/394; 382/8; 356/398; 356/375
[58] Field of Search ................. 356/71, 375, 394, 398, 356/239; 382/8, 48; 358/106

[56] References Cited

U.S. PATENT DOCUMENTS

| | | | |
|---|---|---|---|
| 3,963,354 | 6/1976 | Feldman et al. | 356/239 |
| 4,218,142 | 8/1980 | Kryger et al. | 356/394 |
| 4,441,207 | 4/1984 | Lougheed et al. | 382/8 |
| 4,481,664 | 11/1984 | Linger et al. | 358/106 |
| 4,491,962 | 1/1985 | Sakou et al. | 382/8 |
| 4,555,798 | 11/1985 | Broadbent, Jr. et al. | 358/106 |

FOREIGN PATENT DOCUMENTS

| | | | |
|---|---|---|---|
| 0105661 | 4/1984 | European Pat. Off. | 356/398 |
| 0042790 | 4/1977 | Japan | 356/394 |

OTHER PUBLICATIONS

Goto et al., Proc. of the Fourth International Joint Conf. on Pattern Recognition, 1978, p. 970.
"Automatic Mask Reticle Defect Inspection Device": T. Tokoishi, Electronics Material, Sep. 1983.
"Reticle Defect Inspection System": D. Awamura, Electronics Material, Sep. 1983.

Primary Examiner—F. L. Evans
Assistant Examiner—Joel L. Harringa
Attorney, Agent, or Firm—Oblon, Fisher, Spivak, McClelland & Maier

[57] ABSTRACT

A mask inspection apparatus is arranged to compare a measured data signal obtained by optically measuring a photomask with a design data signal representing an integrated circuit pattern so as to inspect defects of the photomask on which the integrated circuit pattern is drawn. To inspect the pattern area and its peripheral area of the mask in one step, a reference signal generator in the mask inspection apparatus is arranged to generate a reference signal containing a predetermined additional data signal representing the peripheral area of the integrated circuit pattern, in addition to the design data signal representing the integrated circuit pattern. The reference signal is compared with the measured data signal of the pattern area and its peripheral area.

4 Claims, 12 Drawing Figures

FIG. 2A
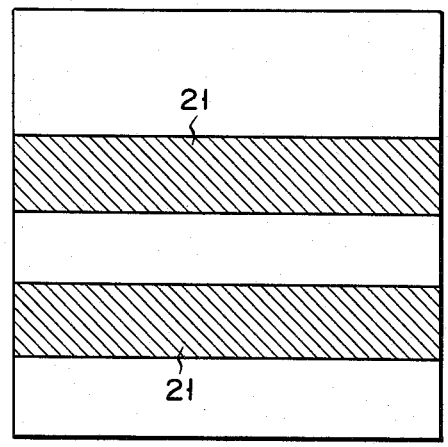
FIG. 2B
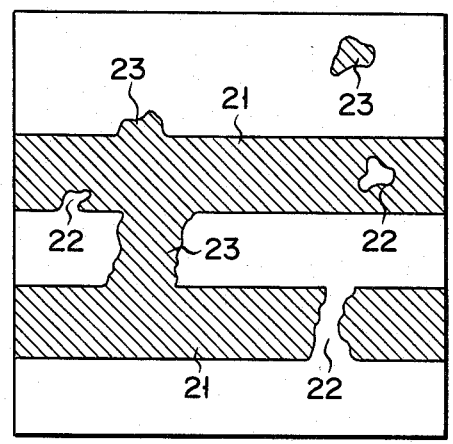
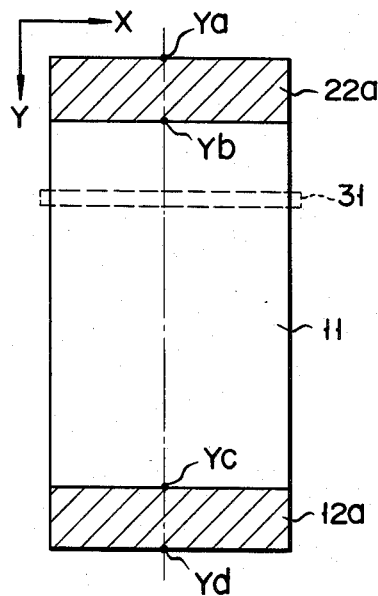
FIG. 3

FIG. 4
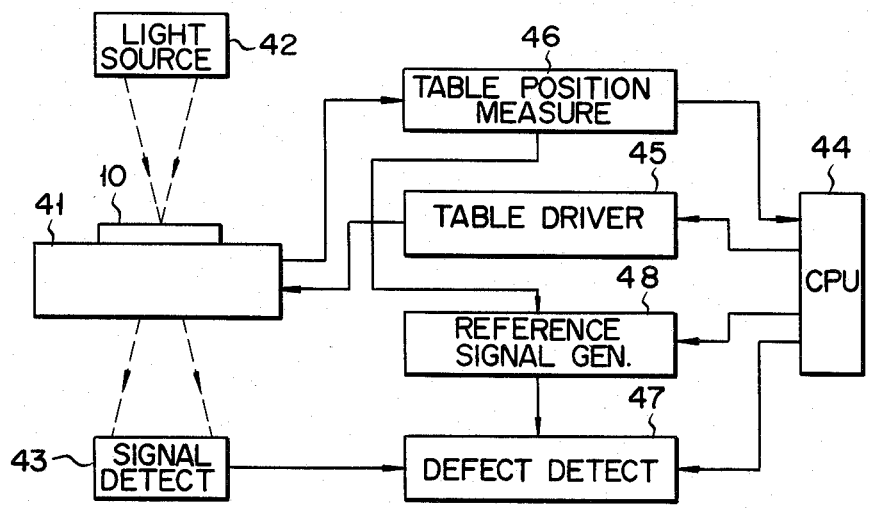
FIG. 6A   FIG. 6B   FIG. 6C
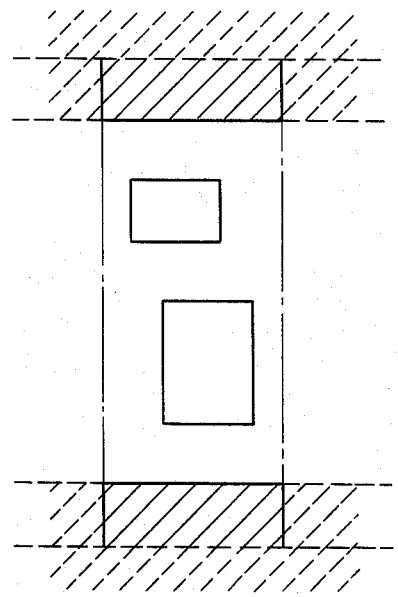 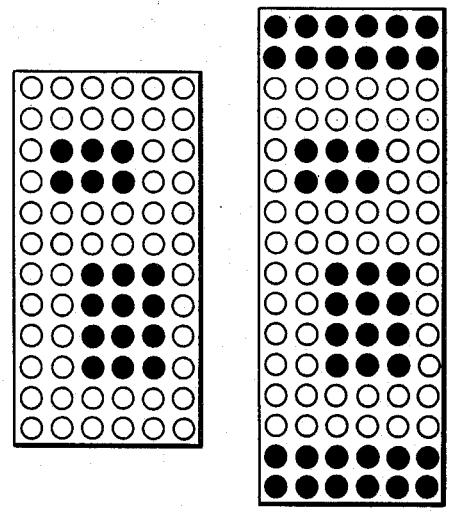

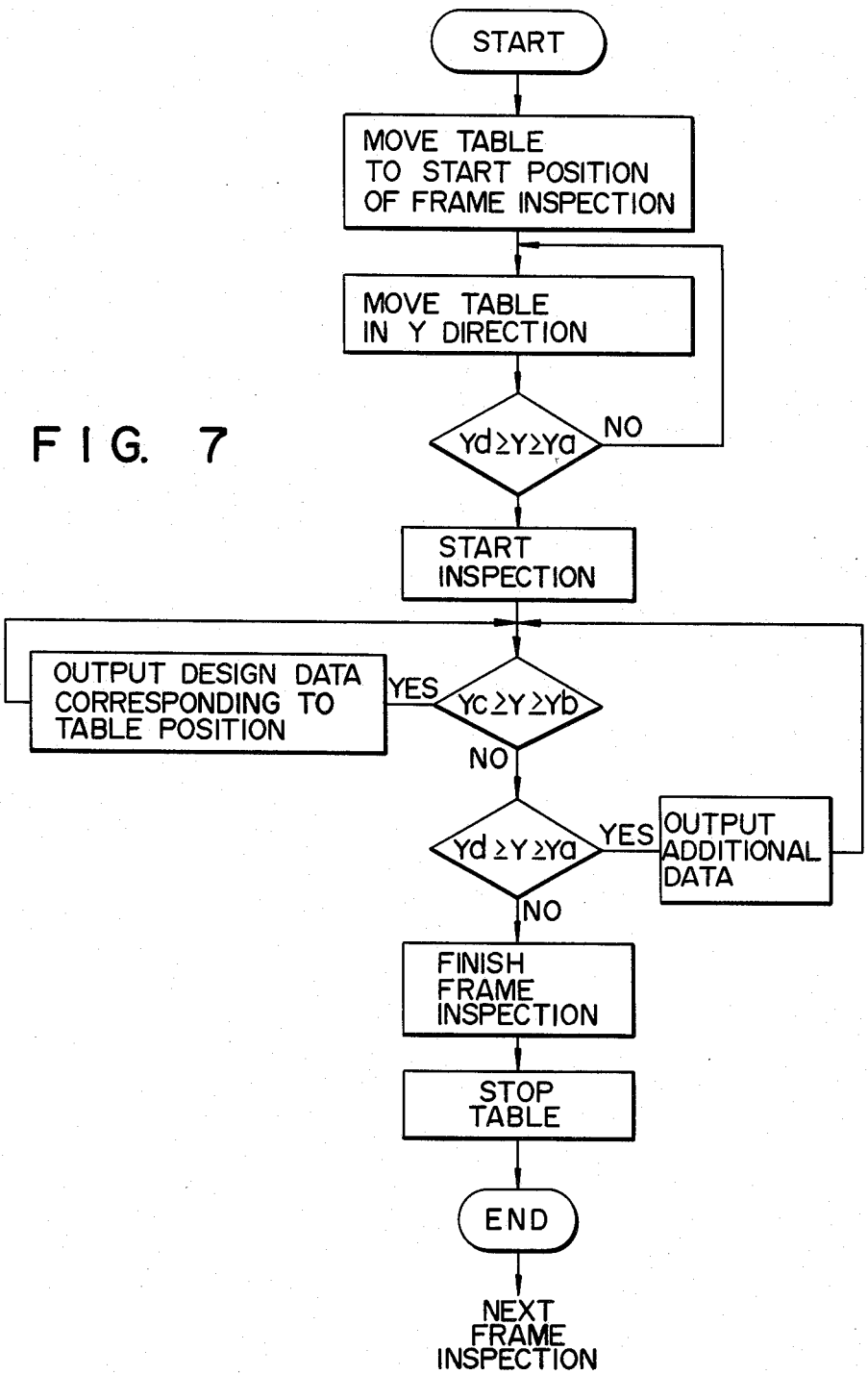
F I G. 7

APPARATUS FOR INSPECTING MASK USED FOR MANUFACTURING INTEGRATED CIRCUITS

BACKGROUND OF THE INVENTION

The present invention relates to an apparatus for inspecting defects of a mask used for manufacturing semiconductor integrated circuits.

A mask having an IC pattern is used to transfer the IC pattern to a semiconductor wafer in the fabrication process of semiconductor ICs. When contamination and partial cutting of an IC pattern of the mask occur, a desired semiconductor IC cannot be prepared, thus decreasing the manufacturing yield of the semiconductor products. A mask inspection apparatus has been conventionally used to detect defects of the IC pattern. According to this apparatus, the mask is irradiated with light, and an optical signal representing a pattern formed on the mask is detected by an image sensor. An electrical mask pattern signal from the image sensor is compared with a reference signal corresponding to design data (LSI chip data) used at the time of forming the mask pattern in units of pixels (dots) so as to detect defects of the mask pattern. A mask inspection apparatus of this type is disclosed in copending U.S. patent applications Ser. No. 535,334, filed Sept. 23, 1983, now U.S. Pat. No. 4,559,603 and entitled "APPARATUS FOR INSPECTING A CIRCUIT PATTERN DRAWN ON A PHOTOMASK USED IN MANUFACTURING LARGE SCALE INTEGRATED CIRCUITS"; and Ser. No. 629,467, filed July 10, 1984, and entitled "APPARATUS FOR INSPECTING MASK FOR USE IN MANUFACTURING LARGE SCALE INTEGRATED CIRCUITS."

When a photomask pattern is inspected by such an apparatus, an area of the photomask corresponding to an LSI chip pattern, which is formed in accordance with the design data, is inspected. After inspection, the photomask is corrected as required. Then, by means of a step and repeat exposure system (hereinafter referred to as stepper), a photoresist layer on a semiconductor wafer is exposed through the mask pattern so that the mask pattern is transferred onto the photoresist layer. In the stepper, the mask pattern is transferred onto the semiconductor wafer for each chip region. The exposing area of the mask for the semiconductor wafer includes a chip pattern portion (light-transmitting and light-shielding portions) and a peripheral portion (light-shielding portion). When a defect such as a pinhole is formed in the peripheral portion of the chip pattern, the defect of the peripheral portion of the mask is transferred onto an adjacent chip region of the semiconductor wafer, yielding defective chips.

In order to solve this problem, a visual inspection of the mask peripheral area by means of a microscope may be conceived. However, when the mask peripheral area is thus visually inspected, the throughput of the inspection step is remarkably degraded. Namely, the automatic inspection of the chip pattern by means of the mask inspection apparatus and the visual inspection of the peripheral area of the chip pattern must be separately performed. Visual inspection is not more precise than automatic inspection, and the operator may fail to find defects. In addition, new defects may be formed between automatic inspection step and visual inspection step.

SUMMARY OF THE INVENTION

It is an object of the present invention to provide a mask inspection apparatus capable of improving the throughput of the inspection process and the inspection precision of the mask.

A mask inspecting apparatus according to the present invention basically comprises a table on which a mask drawn with an integrated circuit pattern to be transferred onto a semiconductor wafer is placed, the mask having a first area having the integrated circuit pattern formed and a second area surrounding the integrated circuit pattern area and having no integrated circuit pattern; table driving means for driving the table in the X and Y directions thereof; position measuring means for measuring a position of the table; mask measuring means for providing, during the movement of the table, a measured signal for the first area of the mask for every measuring position of the table; reference signal providing means for providing a reference signal representing design data of the first area of the mask for every measuring position of the table; and defect detecting means for comparing the measured signal from the mask measuring means and the reference signal from the reference signal providing means for every measuring position of the table to detect defects in the mask.

In order to achieve the above object of the present invention, the mask measuring means is arranged to measure the second area of the mask as well as the first area to provide a measured signal for the first and second areas. The reference signal providing means is arranged to provide the reference signal including predetermined data representing the second area in addition to the design data for the first area. The defect detecting means is arranged to compare the measured signal for the first and second areas detected by the mask measuring means with the reference signal for the first and second areas provided by the reference signal providing means for every table measuring position, thereby detecting defects in the mask.

According to the present invention, the pattern formation area (first area) of a single mask and its periphery (second area) can be automatically measured in one process. Therefore, the throughput of the inspection process can be improved. In addition, unlike the conventional process including the automatic inspection step and the visual inspection step, dust or dirt will not be attached to the mask. The defects in the mask peripheral portion will not be missed.

BRIEF DESCRIPTION OF THE DRAWINGS

FIGS. 2A and 2B are plan views for explaining the defects of the photomask;

FIG. 3 is a view for explaining a unit frame to be inspected in the photomask;

FIG. 4 is a schematic block diagram of a mask inspection apparatus according to an embodiment of the present invention;

FIGS. 6A to 6C are views for explaining design data and additional data of one frame of the photomask; and FIG. 7 is a flow chart for explaining the operation of the mask inspection apparatus shown in FIG. 4.

DETAILED DESCRIPTION OF THE PREFERRED EMBODIMENT

Figure 1A:
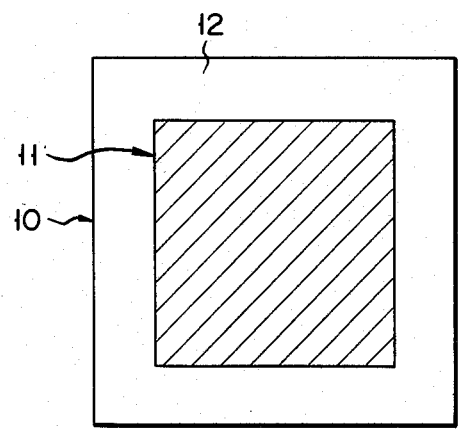
FIGS. 1A to 1C are plan views of a photomask for explaining the photomask inspection area.
Figure 1B:
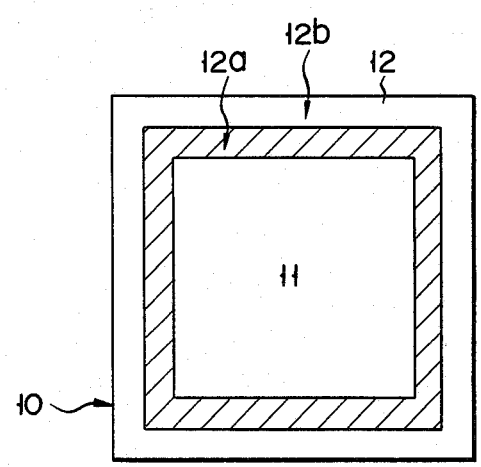
Figure 1C:
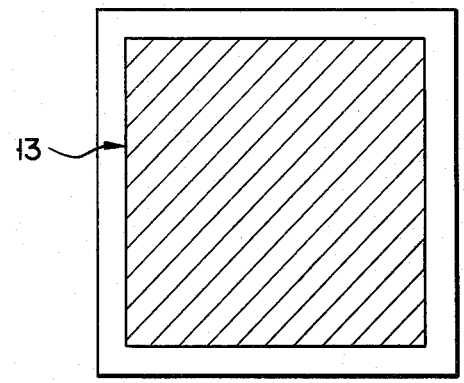

Referring to FIGS. 1A to 1C, an area of a photomask (reticle) which is to be inspected by a mask inspection apparatus of the present invention will be described. A photomask 10 made of a glass substrate has a central area (first area) 11 in which an IC pattern is drawn and a peripheral area (second area) 12 having no IC pattern. The first area 11 consists of light-transmitting and light-shielding portions constituting the pattern. The light-shielding portion consists of a chromium layer formed on the glass substrate. The second area 12 consists of a light-shielding portion. Alternatively, the second area 12 may be light-transmissive according to manufacturing processes of ICs. The peripheral area 12 is divided into an area 12a adjacent to the central area 11 and its outer area 12b. The area 12b of the mask is supported by a mask support member in the stepper. The central area 11 and the part of the area 12a of the peripheral area 12 are used to expose the semiconductor wafer. For this reason, as shown in FIG. 1C, an area 13 consisting of the areas 11 and 12a of the mask 10 is subjected to inspection.

The defects of the mask subjected to inspection will be described with reference to FIGS. 2A and 2B, which show a very small pattern inspection area. FIG. 2A shows a pattern without defects in accordance with design data, and light-shielding portions 21 are indicated by a hatched portion. FIG. 2B shows the same pattern as that of FIG. 2A, but the pattern containing defects, including white defects 22 and black defects 23. A white defect such as a pinhole may also occur in the peripheral area 12.

The inspection area 13 of the mask 10 is divided into, for example, 400 stripe areas or frames along the X direction of the mask. The area 13 is inspected in units of frames. FIG. 3 shows one frame, and the frame inspection is performed in such a way that the pattern is measured by an image sensor every unit distance while shifting the X-Y table in the Y direction. Reference numeral 31 denotes a region which is measured by the image sensor. The image sensor generates a series of data signals in units of pixels along the X direction of the frame. In FIG. 3, Ya denotes an inspection start position; Yb, a design data start position; Yc, a design data end position; Yd, an inspection end position.

A mask inspection apparatus according to the present invention will be described with reference to FIG. 4. A photomask 10 to be inspected is placed by a proper supporting means on an X-Y table 41. A light source 42 is disposed above the table 41. Light emitted from the light source 42 is focused on the photomask 10, and light transmitted therethrough is detected by an image sensor in a signal detector 43. The image sensor serially generates data signals representing a pattern in units of pixels along the X direction of the frame.

The X-Y table 41 is driven by a table driver 45 responsive to a computer (CPU) 44 along the X and Y directions. A position of the table 41 in motion is measured by a table position measuring section 46 having a laser interferometer. The table position data is fetched in the CPU 44 and the reference signal providing section 48.

By moving the table 41 and irradiating the mask 10 with light, the signal detector 43 generates measured signal for the pattern and the peripheral portion of each frame in the mask inspection area 13 in units of pixels.

The measured signal from the signal detector 43 is compared by a defect detector 47 with a reference signal from a reference signal providing section 48 so as to detect defects. The reference signal providing section 48 receives a design data signal ("0", "1" signal) representing the IC pattern in units of pixels from the CPU 44, a predetermined additional binary signal ("0" signal in the case of the light-shielding portion) representing the mask peripheral area, and table position data (representing a pixel position in the mask subjected to inspection) from the table position measuring section 46. The reference signal providing section 48 supplies a reference data signal for the measured signal from the signal detector 43 to the defect detector 47.

FIG. 6A shows a pattern of one frame of the mask to be inspected, FIG. 6B shows dot (pixel) data corresponding to the one-frame mask pattern, and FIG. 6C shows a reference data signal provided by the reference signal providing section 48. A black dot represents a "0" signal for the light-shielding portion (chromium layer), and a white dot represents a "1" signal for the glass substrate. A data signal representing the peripheral area of the mask pattern is added by the reference signal providing section 48 to a design data signal representing the mask pattern.

Figure 5:
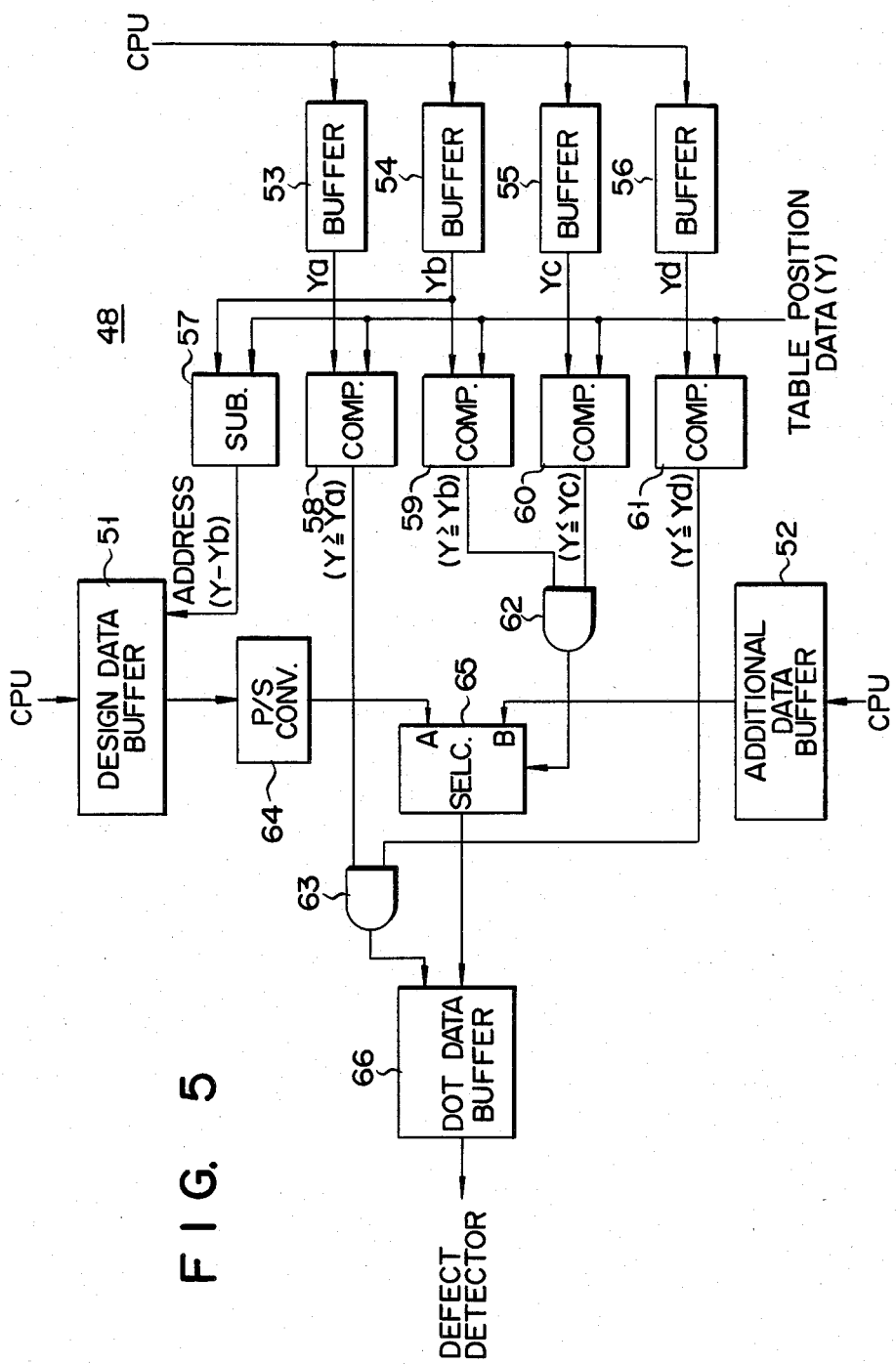
FIG. 5 is a block diagram of a reference signal generator in FIG. 4.

The detailed arrangement of the reference signal providing section 48 will be described with reference to FIG. 5. According to this embodiment, the reference signal providing section 48 comprises a design data buffer 51, an additional data buffer 52, first to fourth data buffers 53 to 56, a subtracter 57, comparators 58 to 61, AND gates 62 and 63, a parallel/serial converter 64, a selector 65 and a dot data buffer 66.

With this arrangement, the dot data signal (FIG. 6B) representing a pattern area within one frame is supplied from the CPU 44 to the design data buffer 51 and is temporarily stored in the design data buffer 51. An additional data signal ("0" signal) representing the peripheral area of the mask is stored in the additional data buffer 52. The frame inspection start position data Ya, the design data start position data Yb, the design data end position data Yc and the inspection end position data Yd are set by the CPU 44 into the first to fourth data buffers 53 to 56, respectively.

Outputs of the first to fourth data buffers 53 to 56 are supplied to the comparators 58 to 61, respectively, to be compared with the table position data (Y) from the table position measuring section 46. The design data start position data Yb and the table position data (Y) are supplied to the subtracter 57, which then calculates a position (Y−Yb) of a measurement scanning line of the one-frame pattern area. The position data (Y−Yb) is supplied to the design data buffer 51 to address a dot data signal on the scanning line of the one-frame pattern area which is being measured. The parallel dot data signal read out from the buffer 51 are supplied to the P/S converter 64 and are converted to serial dot data signal. The serial dot data signal is supplied to the selector 65 together with the additional data from the additional data buffer 52. An output of the selector 65 is supplied to the dot data buffer 66. Outputs of the comparators 58 and 61 are coupled to the AND gate 63, and outputs of the comparators 59 and 60 are coupled to the AND gate 62.

In the reference signal providing section 48, when the table position data Y satisfies Ya≦Y≦Yd, i.e., when the measuring region 31 of the image sensor is located on the mask inspection area 13 and the table is located in the mask inspection enabling position, the outputs of the comparators 58 and 61 are "1," and thus the output of the AND gate 63 becomes "1." As a result, the dot data buffer 66 is enabled by the AND gate 63 to fetch the output of the selector 65. On the other hand, when Ya≦Y<Yb or Yc≦Y<Yd, i.e., when the mask peripheral area is inspected, either output of the comparators 59 and 60 is "0." Therefore, the output of the AND gate 62 becomes "0," causing the selector 65 to selectively feed the output of the additional data buffer 52 to the dot data buffer 66. Further, when Yb≦Y≦Yc, i.e., when the mask pattern area is inspected, the outputs of the comparators 59 and 60 are both "1", and thus the output of the AND gate 62 becomes "1." In this case, the selector 65 feeds the design data from the design data buffer 51 to the dot data buffer 66. The output of the dot data buffer 66 is supplied to the defect detector 47. In this manner, the inspection of the frame as shown in FIG. 3 is performed.

The pattern area is not present in the frames located at the right and left sides of the peripheral area 12a shown in FIG. 1B. In this case, the selector 65 should select the additional data from the additional data buffer 52. For this purpose, position data such as Yb>Yc should be set in the buffers 54 and 55. Under this condition, the output of the AND gate 62 is always "0" so that the selector 65 selects the additional data from the additional data buffer 52. This can be automatically performed by the CPU 44 in accordance with the table position data from the table position measuring section 46.

Frame inspection operation performed under the control of the CPU 44 will be described with reference to FIG. 7. First, the table is moved to the start position for frame inspection. For frame inspection the table is then moved from the start position along the Y direction. Along with movement of the table, the CPU checks whether or not the inspection area is located on the inspection enabling position, i.e., the image sensor measuring region is within the inspection area. This discrimination is performed in accordance with whether or not the table position data Y satisfies the Ya≦Y≦Yd. When the inspection region is not located at the inspection enabling position, the table is moved further along the Y direction. When the inspection region is moved to the inspection enabling position, the comparison inspection as previously described is performed and the reference signal providing section 48 checks whether or not the table position satisfies Yb≦Y≦Yc or Ya≦Y≦Yd. When Ya≦Y≦Yd, the one-scanning line additional data of the peripheral area is supplied to the dot data buffer 66, thereby executing an inspection of the peripheral area. When the inspection regions enters the pattern area, i.e., when Yb≦Y≦Yc, the one-scanning line design data is supplied to the dot data buffer 66, so that the pattern area is inspected. The table position is always detected. When Ya≦Y≦Yd again, the additional data is supplied to the dot data buffer 66. In this manner, one-frame inspection is completed, and the table is stopped. The table is moved to the start position for the next frame inspection.

The present invention is not limited to the above embodiment. For example, to add the additional data corresponding to the peripheral area, the additional data may be added by the CPU to the design data. The defect may be detected by detecting light reflected from the photomask instead of detecting light transmitted through the photomask. In addition, the present invention can also be applied to an X-ray mask or an electron beam mask. The mask may be inspected using an X-ray or an electron beam.

What is claimed is:

1. An apparatus for inspecting a photomask for use in manufacturing large-scale integrated circuits, comprising:
    an X-Y table on which a photomask having drawn thereon an integrated circuit chip pattern to be transferred onto a photoresist layer on a semiconductor wafer is placed, said photomask having a first area on which the integrated circuit chip pattern consisting of light transmitting and shielding portions is drawn, and second and third areas consisting only of one of a light transmitting portion and a light shielding portion with said second area disposed to surround said first area, and said third area disposed to surround said first and second areas, and said first and second areas of said photomask being adapted to expose said photoresist layer on said semiconductor wafer;
    table driving means for moving said X-Y table along X and Y directions thereof;
    position measuring means for measuring a position of said X-Y table;
    light irradiating means for irradiating said photomask placed on said X-Y table with light;
    photomask measuring means responsive to irradiation of said photomask with light for measuring said first and second areas of said photomask to provide a measured signal for each pixel of said first and second areas of said photomask;
    reference signal providing means for providing a reference signal for each pixel of said first and second areas of said photomask, the reference signal including a binary design data signal representing each pixel of the integrated circuit chip pattern drawn on said first area of said photomask and an additional data signal having a predetermined logic level to represent each pixel of said second area of said photomask, said reference signal providing means including means for switching between the binary design data signal and the additional data signal depending on whether a portion of said photomask being measured by said photomask measuring means is in said first area or said second area of said photomask; and
    defect detecting means coupled to said photomask measuring means and said reference signal providing means for comparing the measured signal provided by said photomask measuring means with the reference signal provided by said reference signal providing means for each pixel of said first and second areas of said photomask to detect defects in said first and second areas of said photomask.

2. The apparatus according to claim 1, wherein:
    said first and second areas of said photomask to be inspected are divided into a plurality of stripe areas, and said photomask measuring means is arranged to measure said photomask for each of said stripe areas.

3. The apparatus according to claim 2, wherein said photomask measuring means comprises:
    a soild-state image sensor which is disposed to extend along the width of said stripe area.

4. The apparatus according to claim 1, wherein said reference signal providing means comprises:

first data buffer means for storing the binary design data signal;

second data buffer means for storing the additional data signal;

third data buffer means for storing data representing an inspection area start position of an inspection area including said first and second areas of said photomask;

fourth data buffer means for storing data representing a first area start position;

fifth data buffer means for storing data representing a first area end position;

sixth data buffer means for storing data representing an inspection area end position; and means responsive to said third to sixth data buffer means and said position measuring means for selectively coupling one of said first data buffer means and said second data buffer means to said defect detecting means in accordance with a position of the inspection area being measured by said photomask measuring means.

* * * * *